United States Patent [19]
Carey et al.

[11] Patent Number: 5,360,491
[45] Date of Patent: Nov. 1, 1994

[54] β-SILICON CARBIDE PROTECTIVE COATING AND METHOD FOR FABRICATING SAME

[75] Inventors: Paul G. Carey, Mountain View; Jesse B. Thompson, Brentwood, both of Calif.

[73] Assignee: The United States of America as represented by the United States Department of Energy, Washington, D.C.

[21] Appl. No.: 43,809

[22] Filed: Apr. 7, 1993

[51] Int. Cl.⁵ .................. H01L 31/048; H01L 31/18; H01L 31/0216
[52] U.S. Cl. .................. 136/256; 136/259; 204/192.16; 427/554; 427/372.2; 427/376.1; 427/331; 437/2; 437/173; 257/433; 257/788
[58] Field of Search .............. 136/256, 259; 257/788, 257/433; 204/192.16, 157.41, 157.45, 157.47; 427/331, 372.2, 376.1, 554; 437/2, 173

[56] References Cited

U.S. PATENT DOCUMENTS

| | | | |
|---|---|---|---|
| 4,446,169 | 5/1984 | Castle et al. | 427/554 |
| 4,749,631 | 6/1988 | Haluska et al. | 428/704 |
| 5,106,687 | 4/1992 | Tanino et al. | 428/141 |
| 5,154,810 | 10/1992 | Kamerling et al. | 204/192.13 |

OTHER PUBLICATIONS

T. Sugii et al., IEEE Elec. Dev. Lett. vol. 9 (2) 87 (1988).

*Primary Examiner*—Aaron Weisstuch
*Attorney, Agent, or Firm*—L. E. Carnahan; Roger S. Gaither; William R. Moser

[57] ABSTRACT

A polycrystalline beta-silicon carbide film or coating and method for forming same on components, such as the top of solar cells, to act as an extremely hard protective surface, and as an anti-reflective coating. This is achieved by DC magnetron co-sputtering of amorphous silicon and carbon to form a SiC thin film onto a surface, such as a solar cell. The thin film is then irradiated by a pulsed energy source, such as an excimer laser, to synthesize the poly- or μc-SiC film on the surface and produce β—SiC. While the method of this invention has primary application in solar cell manufacturing, it has application wherever there is a requirement for an extremely hard surface.

20 Claims, 1 Drawing Sheet

β-SILICON CARBIDE PROTECTIVE COATING AND METHOD FOR FABRICATING SAME

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the formation of a silicon carbide film, particularly to beta-silicon carbide films, and more particularly to a method of fabricating polycrystalline β-silicon carbide films as a protective and anti-reflective coating on a solar cell.

Silicon carbide is an attractive material for numerous applications and can exist in over 170 polytypes, most of which are hexagonal or rhombohedral α—SiC, and α—SiC and coatings thereof have been produced by various techniques and for various applications.

While SiC can exist in numerous polytypes, only one type of cubic polytype, or cubic SiC has been identified, and denoted as 3C- or β—SiC. Thin films of beta silicon carbide (β—SiC) are of great interest since the electron transport properties are much better than α—SiC over a wide temperature range of 27°–730° C. Epitaxial films of β—SiC have been primarily grown by chemical vapor deposition, and chemical vapor deposition of high purity β—SiC on the surface of a substrate is exemplified by U.S. Pat. No. 5,106,687 issued Apr. 21, 1992 to K. Tanino et al. By way of example, heterojunction bipolar transistor (HBT) devices have been fabricated using epitaxial β—SiC emitters on Si substrates, and high DC HFE gain of 800 was observed with undetectable recombination current; see T. Sugii et al., IEEE Elec. Dev Lett 9(2) 87 (1988).

More recently, it has been found that pulsed laser processing of thin films of amorphous silicon and carbon co-deposited on various substrates produces β—SiC, with very small crystallites, tens of angstroms in size, and tests have established that no other phases (Si, C, or SiC) were found. This recently found process for producing β—SiC basically involves co-depositing amorphous silicon and carbon on a substrate and then irradiating the thus formed film with a pulsed energy source (e.g. an excimer laser), and is described and claimed in copending U.S. application Ser. No. 08/043,820, filed Apr. 7, 1983, entitled "Pulsed Energy Synthesis And Doping Of Silicon Carbide", and assigned to the same assignee.

A need exists in the field of solar cells for a protective coating to prevent damage to the cell and thus extend the effective life of solar cells. It has been determined that beta silicon carbide films have an extremely hard surface, and it has been recognized that such β—SiC films can produce an antireflective/protective coating on a solar cell, or other applications requiring an extremely hard surface. By forming a β—SiC film on a solar cell, such would prevent damage of the cell due to scratching the surface thereof during cleaning to remove accumulated debris thereon, whereby the solar cell power output can be maintained, as well as providing moisture protection without increasing the mass of the solar cell. Thus, the present invention can significantly increase the life of a solar cell, for example, as well as provide a smooth, hard surface for various applications.

SUMMARY OF THE INVENTION

An object of the present invention is to provide a method for producing a co-sputtered beta-silicon carbide film.

A further object of the invention is to provide a solar cell with a coating of beta-silicon carbide.

A further object of the invention is to provide a solar cell with an anti-reflective/protective coating by forming a β—SiC overlayer on the cell using co-sputtering followed by pulsed excimer laser processing.

Another object of the invention is to provide a method for producing a thin film of extremely hard material on the surface of a component to be protected via laser synthesis of beta-silicon carbide film.

Another object of the invention is to provide a method using pulsed laser processing to produce a protective smooth coating of polycrystalline beta-silicon carbide from co-sputtered amorphous silicon and carbon on a surface.

Another object of the invention is to provide a solar cell with an anti-reflective coating by forming a β—SiC overlayer using co-sputtering of amorphous silicon and carbon to form a thin film, followed by pulsed excimer laser processing.

Other objects and advantages of the invention will become apparent from the following description and accompanying drawings which serve to explain the principles of the invention. Basically, the invention involves forming a smooth, protective coating or layer on a solar cell, or other component, by co-sputtering a film of amorphous silicon and carbon on a surface of the cell and irradiating the thus formed film with pulsed energy from an excimer laser for example, to synthesize the SiC film on the surface of the cell. The thus formed coating is extremely hard as well as being antireflective, and thus provides a protective surface of a solar cell, for example, from damage and moisture.

BRIEF DESCRIPTION OF THE DRAWINGS

The accompanying drawings, which are incorporated into and form a part of the disclosure, illustrate processing sequences of the method of the invention and, together with the description, serve to explain the principles of the invention.

DETAILED DESCRIPTION OF THE INVENTION

The invention is primarily directed to providing an antireflective/protective coating on a solar cell, or other component requiring an extremely hard surface, by forming a β—SiC overlay using DC magnetron co-sputtering of amorphous silicon and amorphous carbon to form a film and thereafter irradiating the film with a pulsed energy source, such as an excimer laser, to synthesize the poly- or μc-SiC film. Inasmuch as the invention is primarily for improving solar cells, the following description will be directed to its application to solar cells, although it is recognized that a β—SiC coating produced by the method of this invention could be applied to the surface of other components which require, or which would be improved by, depositing an ultra-hard coating on a surface thereof. Also, while the method of this invention is achieved by co-sputtering of a 50% Si and 50%C thin film onto a surface of a solar cell which may include an outer surface of silicon, fused silicon, quartz, or plastic, other percentages of Si and C may be used, and are deposited and synthesized at a temperature below the melting temperature of the outer layer of the solar cell.

One of the mechanisms that can reduce solar cell power output is the accumulation of debris on the surface of the cell. This debris must be periodically removed. In order to prevent cell damage (i.e. scratching of the surface) during cleaning, a hard and/or smooth surface is desirable. Also, the surface of the solar cell should be anti-reflective for highest efficiency. Typical solar cell overlayers consists of transparent plastic to protect the cell from moisture and to provide a smooth surface to minimize dust accumulation. These cover layers can provide moisture protection, but their mass and low hardness add weight to the entire assembly and they are not resistant to scratches.

The formation of thin film $\beta$—SiC directly on the cell surface simultaneously reduces the added mass of the assembly and provides a very hard scratch resistant surface. The formation of $\beta$—SiC, rather the $\alpha$—SiC, is important because it exhibits one of the highest material Knoop hardness values (2480), substantially higher than the $\alpha$—SiC having a range of hardness values of 1400–1900 depending on the poly type. The $\beta$—SiC hardness value (2480) is surpassed only by aluminum boride (2500), boron carbide (2750), and diamond (7000).

Figure 1C:
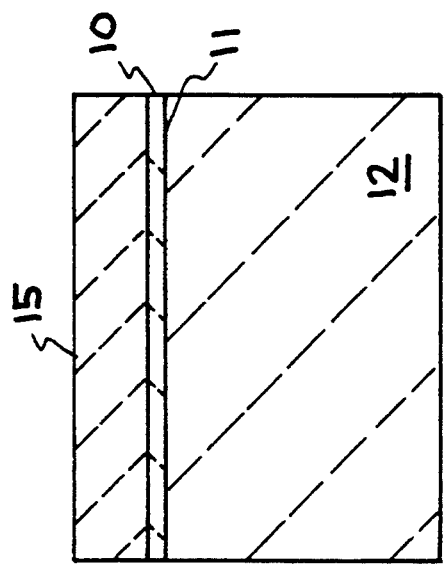
FIGS. 1A, 1B and 1C illustrate processing sequences for producing a protective coating of beta-silicon carbide on a solar cell, in accordance with the present invention.
Figure 1B:
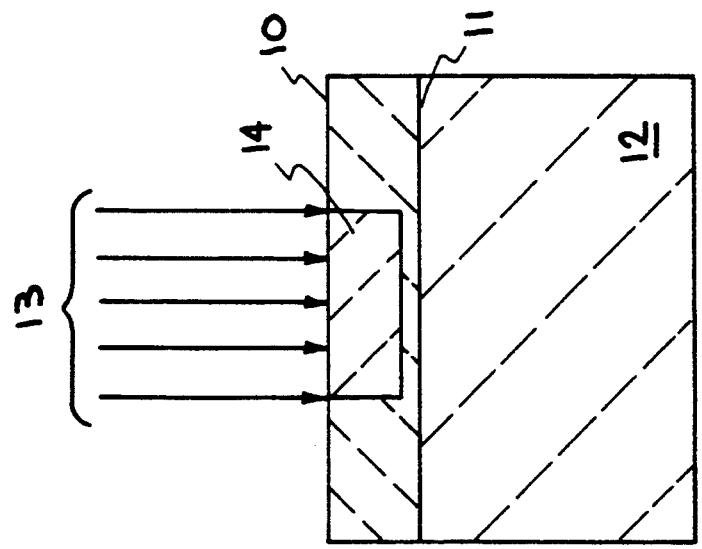
Figure 1A:
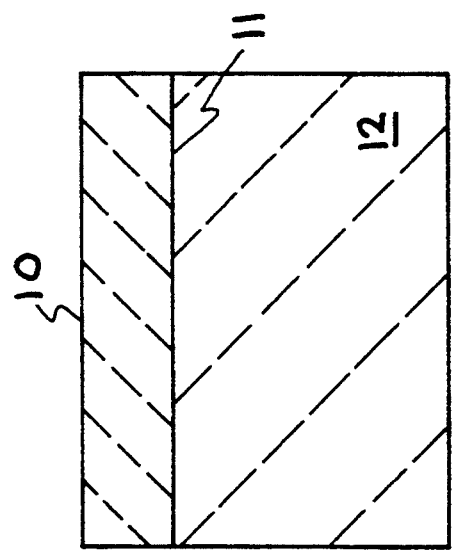

Generally, and as illustrated in FIGS. 1A-1C, the method of this invention is carried out by forming a thin film 10 (100 nm for example) of approximately 50% amorphous silicon (a—Si) and approximately 50% amorphous carbon (a—c) by DC magnetron co-sputtering of the silicon and carbon onto an outer surface 11 of a solar cell 12. This as-sputtered film 10 having a thickness of 10 nm to 10 $\mu$m is an amorphous mixture of Si and C. Poly- and/or $\mu$c-$\beta$—SiC is formed upon subsequent exposure of film 10 to a pulse or beam 13 of a 308 nm XeCl excimer laser radiation, which provides sufficient optical energy during a 35 ns (FWHM) pulse to melt at least a section of the SiC amorphous layer or film 10 to form a molten layer 14, as shown in FIG. 1B. The low thermal budget (i.e. time x temperature) of this laser irradiation step prevents significant heating of the underlying outer surface 11 of solar cell 12. The SiC film or layer 10 is irradiated in a rastering mode by a plurality of similar laser pulses, thereby causing melting of at least a substantial portion of the thickness of the film 10, which results in an outer film or layer 15 of $\beta$—SiC, as seen in FIG. 1C. Thus, the $\beta$—SiC layer or film 15 is therefore formed without damaging the underlying solar cell 12, since preferably the entire thickness of the amorphous SiC film 10 has not been converted to $\beta$—SiC, as illustrated in FIG. 1C. Thus, the sequence of the operational steps of the method are carried out as seen in the drawings and identified as: before laser processing (FIG. 1A), during laser processing (FIG. 1B), and after laser processing (FIG. 1C).

In the initial experiments to verify the invention, the thickness of the $\alpha$—Si/$\alpha$—C (film 10) was 1000 Å, but consideration should be made to match the $\beta$—SiC (film 15) thickness to that of the underlying outer layers or films of solar cell 12 in order maximize the amount of sunlight that is absorbed. For this (1000 Å) film thickness we used a beam size of approximately 1.1 cm×1.1 cm and a laser energy of 570 mJ/pulse. This corresponds to approximately 350 mJ-cm$^{-2}$ at the cell surface. This is below the melting threshold of 700 mJ-cm$^{-2}$ of the underlying silicon film or layer of the solar cell, and thus this underlying film is not melted. Different Si/C deposited thicknesses will require different laser energy densities. In carrying out these experiments, the $\alpha$—Si/$\alpha$—C film deposited on the solar cell was irradiated with approximately four (4) pulses at each location in a rastering mode to form the $\beta$—SiC layer or film, as shown at 15 in FIG. 1C. In general, the number of pulses should be chosen to synthesize the entire co-sputtered Si/C film into $\beta$—SiC. The number of laser pulses will vary for different solar cell substrates and the film deposition thickness.

The followings sets forth an example of a specific sequence of operational steps, for preparing the substrate and co-sputtering the amorphous silicon and carbon thereon, prior to the laser irradiation process, which results in the formation of an anti-reflective/protective coating of $\beta$—SiC on a solar cell.

A solar cell substrate (e.g. single crystal silicon, $\alpha$—Si, GaAs, CuInSe$_2$, CdTe) is first cleaned or degreased using either a 3:1 H$_2$SO$_4$:H$_2$O$_2$+5:1:1 H$_2$O:H$_2$O$_2$:HCl (RCA) clean for single crystal or amorphous silicon or a solvent clean (e.g. trichloroethylene) (TCE)+acetone+methanol rinse sequence) for other types of substrates. The following table sets forth the RCA clean sequence for single crystal or amorphous silicon:

| TIME | MATERIAL | TEMP. |
| --- | --- | --- |
| 10 min. | 3:1 H$_2$SO$_4$:H$_2$O$_2$ clean | 90° C. |
| 4 min. | De-ionized H$_2$O rinse | 25° C. |
| 10 min. | 5:1:1 H$_2$O:H$_2$O$_2$:HCl clean | 70° C. |
| 4 min. | De-ionized H$_2$O rinse | 25° C. |
| 15 sec. | 50:1 H$_2$O:HF clean | 25° C. |
| 4 min. | De-ionized H$_2$O rinse | 25° C. |

Once the solar cell substrate is degreased, it is placed in a sputtering deposition chamber for the Si/C co-sputter deposition step. The desired ratio of Si:C is 1:1 to insure the most efficient synthesis of SiC. The general deposition procedure is as follows:

| STEP | PROCEDURE |
| --- | --- |
| 1 | record chamber base pressure |
| 2 | zero instruments |
| 3 | ensure coolant is on |
| 4 | set chamber pressure to 10 m Torr of Ar |
| 5 | adjust throttle valve position for an Ar flow of 10 scc/min. |
| 6 | adjust carbon target power source to 151 Watts |
| 7 | warm up carbon target for 2 min. |
| 8 | adjust silicon target power source to 53 Watts |
| 9 | warm up silicon target for 2 min. |
| 10 | open shutter to allow deposition of $\alpha$-Si/C for time to obtain desired thickness |

This general procedure can be modified for other deposition machines. The important parameters of chamber pressure, flow rates, and powers should be modified for each chamber and target to maintain a 1:1 deposition ratio of Si:C. The deposited film thickness is determined by considering the optical properties of $\beta$—SiC such that the resultant film will serve as an anti-reflective coating for the underlying solar cell. The thickness is thus chosen to minimize the total reflection from the optical stack on the solar cell surface.

The as-deposited film on the solar cell, as described above, is then ready for the laser irradiation procedure, described in detail above, whereby poly- and/or μc-β—SiC is formed upon exposure to the excimer laser pulse, which provides sufficient optical energy during the ~35 ns (FWHM) pulse to melt the Si/C amorphous layer, without thermally damaging the underlying solar cell due to heating thereof.

It has thus been shown that the present invention provides a betasilicon carbide film or coating, particularly adapted as a protective and antireflective coating for solar cells, for example. Due to the hardness of the betasilicon carbide film or coating, it has application in various areas requiring an extremely hard surface.

While a specific sequence of operational steps materials, parameters, laser energy, pulse lengths, etc. have been set forth to explain the polycrystalline beta-silicon carbide film and method of fabricating same, such is not intended to be limiting. Modifications and changes will become apparent, and it is intended that the invention be limited only by the scope of the appended claims.

We claim:

1. In a solar cell, the improvement comprising:
   an anti-reflective/protective coating of beta-silicon carbide on an outer surface of the solar cell;
   said coating having a thickness of 10 nm to 10 μ.

2. The improvement of claim 1, wherein said coating is produced from a ratio of about 1:1 of amorphous silicon and amorphous carbon co-sputtered on the outer surface of the solar cell, and then irradiated with pulsed laser energy without thermally damaging the underlying solar cell.

3. The improvement of claim 2, wherein the pulsed laser energy is provided by at least one pulse of about 35 ns in duration.

4. The improvement of claim 3, wherein the laser pulse of about 35 ns in duration is provided by an excimer laser.

5. The improvement of claim 4, wherein the excimer laser an XeCl excimer laser having a wavelength of 308 nm.

6. A method for providing a solar cell with an antireflective/protective coating of beta-silicon carbide, comprising the steps of:
   co-sputtering a film of amorphous silicon and amorphous carbon on an external surface of a solar cell; and
   irradiating the thus formed film with pulsed energy thereby causing the formation of beta-silicon carbide.

7. The method of claim 6, wherein the amorphous silicon and the amorphous carbon are co-sputtered in a ratio of about 1:1.

8. The method of claim 6, additionally including the step of cleaning a surface of the solar cell prior to the step of co-sputtering the film thereon.

9. The method of claim 6, wherein the step of irradiating the film with pulsed energy is carried out by directing at least one pulse of laser energy of about 35 ns time duration onto the film.

10. The method of claim 9, wherein the at least one pulse of laser energy is produced by an XeCl excimer laser.

11. The method of claim 6, wherein the steps of co-sputtering the film and irradiating the thus formed film are carried out at temperatures and time periods so as to prevent any thermal damage to the underlying solar cell.

12. The method of claim 11, wherein the film has a thickness of 10 nm to 10 μm, and the irradiating pulsed energy is approximately 350 mJ/cm$^{-2}$ at the surface of the solar cell.

13. The method of claim 11, wherein the irradiating pulsed energy is produced by at least one pulse of a 308 nm XeCl excimer laser.

14. The method of claim 6, wherein the film thickness co-sputtered onto the solar cell is determined by considering the optical properties of betasilicon carbide so as to produce an anti-reflective coating for the underlying solar cell.

15. The method of claim 6, wherein the irradiating pulsed energy is produced by an excimer laser capable of producing sufficient optical energy during a pulse of about 35 ns to melt at least a portion of the film without thermal damage to the solar cell.

16. The method of claim 15, wherein said pulse of about 35 ns is produced by an XeCl excimer laser having a wavelength of 308 nm.

17. The method of claim 6, wherein the step of irradiating the film is carried out by directing a plurality of pulses from a 308 nm XeCl excimer laser onto the film causing melting of at least a substantial portion thereof without melting the surface of the solar cell.

18. In a method for producing a solar cell including a film of beta-silicon carbide having a Knoop hardness value of over 2000, the improvement comprising:
   codepositing a film of amorphous silicon and amorphous carbon on a solar cell; and
   directing a plurality of laser pulses onto the thus formed film to synthesize the film and produce beta-silicon carbide.

19. The method of claim 18, wherein the amorphous silicon and the amorphous carbon are co-deposited by a co-sputtering technique in a ratio of about 1:1.

20. The method of claim 18, wherein the step of directing laser pulses is carried out using pulses of about 35 ns duration produced by a 308 nm XeCl excimer laser.

* * * * *